(12) United States Patent  
Raynor

(10) Patent No.: US 8,796,936 B2  
(45) Date of Patent: Aug. 5, 2014

(54) COMPACT FLUORESCENT LAMPS

(75) Inventor: Jeffrey M. Raynor, Edinburgh (GB)

(73) Assignee: STMicroelectronics (Research & Development) Limited, Marlow-Buckinghamshire (GB)

(*) Notice: Subject to any disclaimer, the term of this patent is extended or adjusted under 35 U.S.C. 154(b) by 480 days.

(21) Appl. No.: 12/969,095

(22) Filed: Dec. 15, 2010

(65) Prior Publication Data

US 2011/0140613 A1 Jun. 16, 2011

(30) Foreign Application Priority Data

Dec. 16, 2009 (GB) .................................. 0921944.5

(51) Int. Cl.
*H05B 37/02* (2006.01)

(52) U.S. Cl.
USPC .......................................... 315/158; 315/149

(58) Field of Classification Search
USPC ........................................................ 315/158
See application file for complete search history.

(56) References Cited

U.S. PATENT DOCUMENTS

| | | | |
|---|---|---|---|
| 3,971,065 A | 7/1976 | Bayer | 358/41 |
| 7,265,332 B2 | 9/2007 | Baxter et al. | 250/214 |
| 7,318,658 B2 * | 1/2008 | Wang et al. | 362/253 |
| 7,358,584 B2 | 4/2008 | Raynor | 257/439 |
| 2005/0161603 A1 | 7/2005 | Kerr | 250/330 |
| 2006/0261741 A1 * | 11/2006 | Hwang | 315/56 |
| 2007/0109763 A1 | 5/2007 | Wolf et al. | 362/86 |
| 2007/0120058 A1 | 5/2007 | Blackwell et al. | 250/338.1 |
| 2009/0295303 A1 * | 12/2009 | Pucko et al. | 315/246 |
| 2010/0117509 A1 * | 5/2010 | Li et al. | 313/323 |

FOREIGN PATENT DOCUMENTS

| | | | |
|---|---|---|---|
| CN | 2481111 | 3/2002 | H03K 17/94 |
| CN | 2917171 | 6/2007 | H05B 37/02 |
| CN | 201123158 | 9/2008 | A47H 5/02 |
| CN | 201344381 | 11/2009 | F21L 4/00 |
| EP | 1107222 | 6/2001 | |
| EP | 2075844 | 7/2009 | |
| FR | EP 1 107 222 | * 6/2001 | G09G 3/34 |
| GB | 2152691 | 8/1985 | G02F 1/133 |
| JP | 2006105877 | 4/2006 | |
| WO | 92/20959 | 11/1992 | F21V 23/00 |
| WO | 2005018286 | 2/2005 | |
| WO | 2005098956 | 10/2005 | |
| WO | 2008/097705 | 8/2008 | G01J 1/42 |

* cited by examiner

*Primary Examiner* — Victor A Mandala
*Assistant Examiner* — William Harriston
(74) *Attorney, Agent, or Firm* — Allen, Dyer, Doppelt, Milbrath & Gilchrist, P.A.

(57) ABSTRACT

An ambient light sensor integrated in a compact fluorescent lamp that, in turn, may include a controller and a radiation source. The ambient light sensor may include a radiation receiver to receive and filter incident radiation to obtain a value of the level of infrared radiation, and an electronic module to determine if the value is above a reference threshold value to enable the controller to switch the state of the radiation source.

19 Claims, 6 Drawing Sheets

COMPACT FLUORESCENT LAMPS

FIELD OF THE INVENTION

The present invention refers to improvements in or relating to compact fluorescent lamps, and in particular to improvements in the automatic operation of compact fluorescent lamps.

BACKGROUND OF THE INVENTION

Nowadays, with respect to ambient light detection for a room, for example, the use of an external ambient light sensor to control the switching on/off state of a compact fluorescent light (CFL) may be known. The ambient light sensor activates a controller of the CFL to either switch on or off the CFL. The ambient light sensor comprises one or more photosensitive elements having an electrical property that changes upon incidence of light, together with circuitry for converting the changed electrical property into a signal. As an example, an image sensor may comprise a photodetector that generates a charge when radiation is incident upon it. The photodetector may be designed to be sensitive to electromagnetic radiation in the range of (human) visible wavelengths. Circuitry is provided that collects and carries the charge from the radiation sensitive element for conversion to a value representing the intensity of incident radiation.

The basic physical principles of operation of an ambient light sensor are similar to those of digital image sensors, such as complimentary metal oxide semiconductor (CMOS) or charge-coupled device (CCD) image sensors used in digital cameras, mobile telephones, webcams, and various other devices. In theory, an image sensor of that type could be used to provide information on the ambient light levels, however, these devices have many pixels and often complicated signal processing circuitry to decode color, defect correction, etc. meaning that they generally require a relatively larger amount of power to operate (50 mW typical). Also, as these sensors have a large number of pixels, it may be computationally expensive to process them. Finally, their sensors are usually color (e.g. Bayer pattern, as disclosed in U.S. Pat. No. 3,971, 065) with different sensitivities for red, green, and blue, which may require additional processing to obtain only the brightness information. For these reasons, the use of a standard, mega-pixel type image sensor may not be appropriate for measuring ambient light levels.

An ambient light sensor is distinguished from a mega-pixel type image sensor by its relatively small number of pixels. The number of pixels may not yield sufficient image data for the reconstruction of an image, either for representation to a human or to a machine. An ambient light sensor may comprise a single photodetector, or a very small array of photodetectors, typically less than ten. Also, because of the relatively small number of pixels, the pixels of an ambient light sensor may typically be larger than those used in typical mega-pixel type image sensors.

The ambient light sensor detects the ambient light level, which corresponds to the level of (human) visible light. The visible light comprises atmospheric light levels from 400 nm to 700 nm, for example, and the light from the CFL. The detected level of visible light is compared with a reference threshold value to operate the controller to either switch on the CFL, or switch off the CFL, depending on the result of the comparison.

When the detection occurs during the night, and the CFL is switched off, for example, the atmospheric light levels may be zero or negligible, and there is typically no light from the CFL. As a result, there is zero or negligible visible light. Therefore, the detected level of visible light is below the reference threshold value, and the ambient light sensor operates the controller of the CFL to switch on the CFL.

However, to switch the CFL off at the right time, the ambient light sensor may distinguish between the atmospheric light and the light from the CFL itself. This problem is currently addressed by choosing a physical arrangement of components that seeks to reduce the interference of the two sources of light (atmospheric and CFL), for example, in a street light, the CFL will be directed in a downward direction, and the ambient light sensor will be directed in the opposite, upward direction, and also sometimes within a collar or other light shield to further isolate the ambient light sensor from the CFL. In an indoor environment, the shielding of ambient light sensors is even more difficult. However, as well as the additional structural complexities involved, the influence of the CFL light may not be perfectly isolated from the atmospheric light. Because of this, the thresholds that the ambient light sensor uses are sub-optimal, which may result in energy being wasted because CFLs are typically kept on for longer than needed during the day time.

SUMMARY OF THE INVENTION

It is an object of the present invention to overcome at least some of the problems associated with the prior art. According to one aspect, an ambient radiation sensor is provided that is sensitive to infrared radiation.

"Light" is a term usually used to refer to electromagnetic radiation having wavelengths in the visible range of the electromagnetic spectrum, that is, from approximately 380 nm to 750 nm. Prior art ambient light sensors are designed to be sensitive to radiation within this range, in an attempt to mimic the sensitivity of the human eye so that they can be used to determine when the light levels detectable by humans are above or below predetermined thresholds. However, the inventor has realized that an existing ambient light sensor can be modified to be sensitive to electromagnetic radiation outside of the visible range, and as such, the sensor is termed more generally as an ambient radiation sensor, "light" being one example of the radiation. It will be appreciated that an ambient radiation sensor that is sensitive to infrared radiation may also be sensitive to radiation in other ranges of the electromagnetic spectrum, as discussed later.

The ambient radiation sensor may include: a radiation receiver to receive and filter incident radiation to obtain a value of the level of infrared radiation; and an electronic module to determine if the value is above a predetermined reference threshold value. Optionally, the radiation receiver may include a photodiode.

The photodiode may include a substrate having a very heavily doped bulk portion of a first conductivity type; a lightly doped upper layer of the first conductivity type, a heavily doped region of the first conductivity type, a lightly doped region of a second conductivity type, and a heavily doped region of the second conductivity type formed in the lightly doped region of a second conductivity type. The depth of the junction between the lightly doped upper layer of the first conductivity type and the lightly doped region of the second conductivity type may be chosen for the collection of electrons resulting from the photogeneration of incident radiation in both the infrared and visible spectra.

The photodiode may include a substrate having a very heavily doped bulk portion of a first conductivity type, a lightly doped upper layer of the first conductivity type, a heavily doped region of the first conductivity type forming the first well, a lightly doped region of a second conductivity type, a heavily doped region of the second conductivity type formed in the lightly doped region of a second conductivity type, and a triple well structure of the first conductivity type formed in the lightly doped region of a second conductivity type. The junction between the lightly doped upper layer of the first conductivity type and the lightly doped region of the second conductivity type may be formed in the lightly doped upper layer of the first conductivity type close or as close as possible to the very heavily doped bulk portion of the substrate. The substrate may be a silicon substrate. The ambient radiation sensor may further include an infrared filter.

The ambient radiation sensor may comprise an electronic module. The electronic module may comprise a read out electronic circuit. The electronic module may comprise an operational amplifier. The electronic module may comprise a reference module. The reference module may comprise an exposure control module. The reference module may comprise a programming module.

According to a second aspect a compact fluorescent lamp (CFL) comprising an integrated ambient radiation sensor that is sensitive to infrared radiation is provided. The CFL may comprise a controller and a radiation source. The ambient radiation sensor may comprise a radiation receiver to receive and filter incident radiation to obtain a value of the level of infrared radiation, and an electronic module to determine if the value is above a predetermined reference threshold value to enable the controller to switch the state of the radiation source.

The ambient radiation sensor may be provided in or on a ballast housing. An aperture may be formed in the ballast housing over the ambient radiation sensor. If the aperture in the ballast housing is not directly above the ambient radiation sensor, a "light pipe" may be used to transfer light from the aperture in the ballast housing to the ambient radiation sensor. The radiation receiver may comprise a photodiode.

The photodiode may comprise, a substrate having a very heavily doped bulk portion of a first conductivity type; a lightly doped upper layer of the first conductivity type, a heavily doped region of the first conductivity type, a lightly doped region of a second conductivity type, and a heavily doped region of the second conductivity type formed in the lightly doped region of a second conductivity type. The depth of the junction between the lightly doped upper layer of the first conductivity type and the lightly doped region of the second conductivity type is chosen for the collection of electrons resulting from the photogeneration of incident radiation in both the infrared and visible spectra.

The photodiode may include a substrate having a very heavily doped bulk portion of a first conductivity type; a lightly doped upper layer of the first conductivity type; a heavily doped region of the first conductivity type; a lightly doped region of a second conductivity type; a heavily doped region of the second conductivity type formed in the lightly doped region of a second conductivity type; and a triple well structure of the first conductivity type formed in the lightly doped region of a second conductivity type. The junction between the lightly doped upper layer of the first conductivity type and the lightly doped region of the second conductivity type may be formed in the lightly doped upper layer of the first conductivity type close, or as close as possible, to the very heavily doped bulk portion of the substrate.

The substrate may be a silicon substrate. The ambient radiation sensor may further comprise an infrared filter.

The CFL may comprise an electronic module. The electronic module may comprise a read out electronic circuit. The electronic module may also comprise an operational amplifier. The electronic module may also comprise a reference module. The reference module may comprise an exposure control module. The reference module may also comprise a programming module.

BRIEF DESCRIPTION OF THE DRAWINGS

Reference will now be made, by way of example, to the accompanying drawings, in which.

DETAILED DESCRIPTION OF THE PREFERRED EMBODIMENTS

Figure 1:
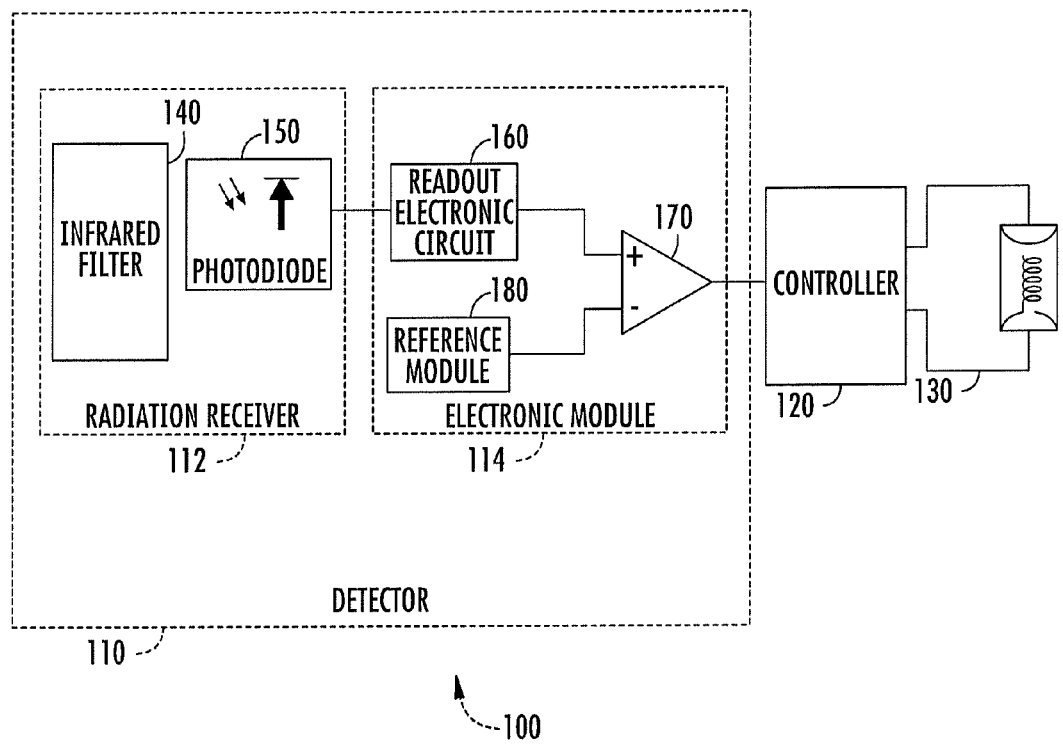
FIG. 1 is a schematic block diagram of a CFL combined with an ambient radiation sensor in accordance with an embodiment.

FIG. 1 shows a compact fluorescent lamp (CFL) 100. The CFL 100 comprises a detector 110, a controller 120, and a radiation source 130 such as a bulb. The detector 110 forms part of the ambient light sensor (ALS) in accordance with the present embodiments. The controller 120 forms part of the controller of the CFL 100.

The detector 110 comprises a radiation receiver 112 and an electronic module 114 as will be described below. The radiation receiver 112 can receive any type of radiation. The radiation receiver 112 may comprise an infrared filter 140. The filter 140 can be, for example, an external plastic filter specifically manufactured to allow the transmission of infrared radiation only (i.e. electromagnetic radiation from 700 nm to 300 µm) into the detector 110. As a result, the filter 140 may prevent the transmission of other types of radiation, for example, visible light (i.e. electromagnetic radiation from 400 nm to 700 nm) into the detector 110.

The radiation receiver 112 may also comprise a photodiode 150 connected to the infrared filter 140. The photodiode 150 is a photo detector which may convert incident radiation on the photodiode 150 into either a corresponding current or a corresponding voltage. In the present embodiment, the photodiode 150 receives infrared radiation from the infrared filter 140. The photodiode 150 then converts infrared radiation into a corresponding signal (charge, voltage, or current).

Figure 12:
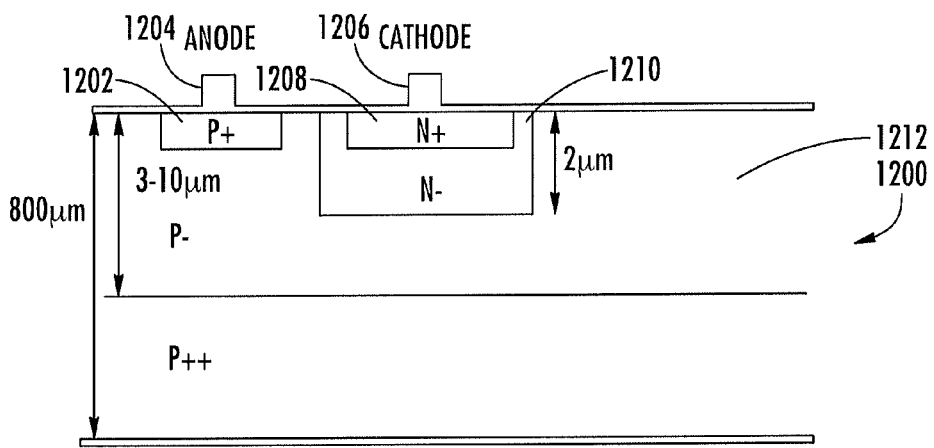
FIG. 12 is a schematic of diagram of a photodiode design according to one embodiment, which is suitable for detection of visible and IR radiation.
Figure 13:
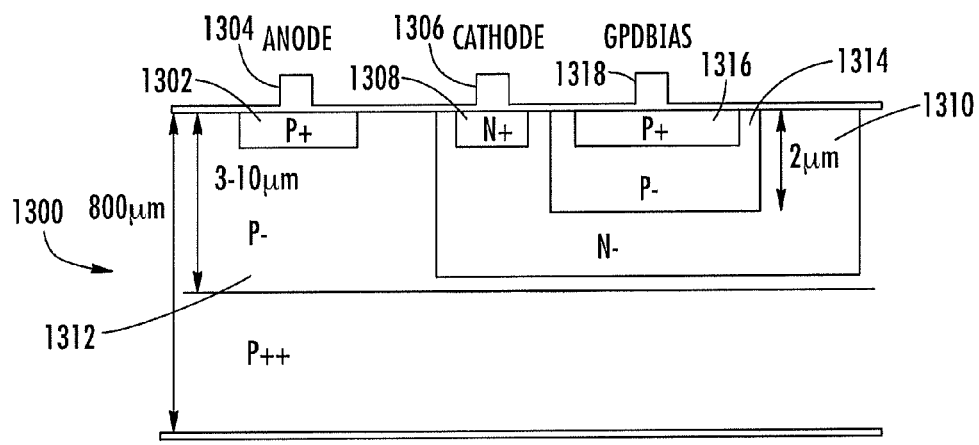
FIG. 13 is a schematic diagram of an alternative photodiode design, which is suitable for detection of IR radiation and rejection of visible radiation.

FIGS. 12 and 13 show some example photodiode designs for carrying out the present embodiments. FIG. 12 schematically shows a cross section of a photodiode that is suitable for detection of both visible and infrared radiation. The components of the photodiode are formed in/on a substrate 1200, which, in this example, is very heavily p-doped (the level of doping of a region is annotated by convention with a "−" indicating a lightly doped region, a "+" indicating a heavily doped region, and a "++" indicating a very heavily doped region. The levels of doping are defined relative to each other, with a "heavy" level of doping corresponding to a greater concentration of group III or group V doping elements for p or n type doping respectively).

The substrate 1200 may be any doped group IV semiconductor. Silicon may be preferred in the present context, as it is much cheaper than other materials. Silicon detects relatively well at near IR wavelength ranges (700 nm-800 nm). In addition, silicon detects light at wavelengths in the region up to 1100 nm if the junctions are deeper. Even if silicon offers a performance that is less than ideal for detection of infrared radiation, it may still be suitable for the purposes of an ambient radiation sensor because the sensor may be used for a basic detection of whether a given threshold has been exceeded or not, rather than for the construction of complex image data. As such, any suboptimal aspects of using silicon as compared with other materials can be accounted for by an appropriate choice of threshold level, and/or customised pixel design, as shown for example in FIGS. 12 and 13. Other materials may include mercury, cadmium, telluride (Hg, Cd, Te), or germanium, although silicon is preferred.

Turning back to FIG. 12, the photodiode's anode comprises a P+ well 1202 and metallization 1204, while its cathode comprises metallization 1206 and an N− well region comprising an N− well 1210 within which is formed a heavily doped N+ region 1208. This N-well region is formed by a so-called "double well" manufacturing process.

The wafer substrate 1200 is shown as being 800 μm thick, although it will be appreciated that this is for illustration purposes only and that any suitable thickness may be chosen. Most of the substrate 1200 is very heavily doped (P++). However a region 1212 close to the top of the substrate 1200 is more lightly doped (P−), and the photodiode components are formed within this P− layer 1212.

The depth of the P− layer is typically between 3 and 10 μm. An N− well is formed in the P− layer (usually by implantation), typically being less deep (2 μm) than that P− layer and not contacting the P++ part of the substrate. The penetration depth of photons into a given substrate is dependent on the wavelength of the incident radiation. A longer wavelength may penetrate deeper into the substrate. For a silicon substrate 1200, the photodiode of FIG. 12 is sensitive to wavelengths of light from 350 nm to 900 nm with peak sensitivity around 500 nm. The depths of the wells/implants can be chosen differently for different substrates. The particular depths required may depend on the lattice structure of the different materials in a well known manner. Heavily doped P+ and N+ regions 1202, 1208 form the contacts for the anode 1204 and cathode 1206.

FIG. 13 shows an alternative embodiment, wherein a photodiode is designed to detect IR radiation, but to reject visible radiation. Because longer wavelength photons penetrate deeper into a substrate, it may be possible to reject most of the visible photons by collecting only the charge generated deeper in the substrate.

The structure of FIG. 13 is similar to that of FIG. 12, but a "triple well process" is desirable. The components of the photodiode are formed in/on a substrate 1300, which, in this example, is very heavily p-doped. The photodiode's anode comprises a P+ well 1302 and metallization 1304, while its cathode comprises metallization 1306 and an N-well region comprising an N− well 1310 within which is formed a heavily doped N+ region 1308.

The wafer substrate 1300 is shown as being 800 μm thick, although it will again be appreciated that this is for illustration purposes only and that any suitable thickness may be chosen. Most of the substrate 1300 is very heavily doped (P++). However a region 1312 close to the top of the substrate 1300 is more lightly doped (P−), and the photodiode components are formed within this P− layer 1312.

The depth of the P− layer is typically between 3 and 10 μm. An N− well 1310 is formed in the P− layer (usually by implantation). The depth of the N-well is greater than that of the N-well 1201 of the photodiode shown in FIG. 12, so that the photodiode junction is deeper in the substrate than would normally be the case. The depth of the N− well 1310 may be as deep as possible without it contacting the highly doped P++ portion of the substrate 1300. If the N− well 1201 region was to contact the substrate, then the photodiode would only collect photocharge around the periphery, as electron-hole pairs generated in the P++ substrate region will recombine due to the higher doping level.

Heavily doped P+ and N+ regions 1302, 1308 form the contacts for the anode 1304 and cathode 1306. The N− well 1310 is also provided with a separate double well p-type structure that comprises a P− well 1316 and a heavily doped P+ region forming a contact for a GPDBIAS metallization 1318. In a preferred embodiment, both the anode 1304 and GPDBIAS 1318 are at ground, and the cathode 1306 is used to detect the photocurrent.

It is also to be noted that, generally speaking, the conductivity types can be reversed (that is, we can switch "P" type conductivity for "N" type conductivity and vice versa in the discussions above). Generally, first and second conductivity types may be provided. If the first conductivity type is "P" type, the second will be "N" type and vice versa.

Another embodiment may also refer to a radiation receiver 112, which comprises a photodiode 150 without the presence of the filter 140. In this situation, the photodiode 150 is manufactured to be sensitive to infrared radiation only.

An alternative embodiment of the radiation receiver 112 can also comprise a combination of both a filter 140, which transmits infrared radiation but blocks visible (350 nm-700 nm) radiation, and a photodiode 150 sensitive to infrared radiation only. This combination can improve the system's rejection of light from the CFL, as the characteristics of the IR pass filter may not be perfect.

The detector 110 also comprises an electronic module 114. In the detector 110, the radiation receiver 112 is connected to the electronic module 114. The electronic module 114 comprises a readout electronic circuit 160, an operational amplifier 170, and a reference module 180 as will be described below.

The photodiode 150 of the radiation receiver 112 is connected to the readout electronic circuit 160 of the electronic module 114. The readout electronic circuit 160 may be a readout electronic circuit, as discussed below, or other equivalents. As such, the readout electronic circuit converts the current from the photodiode 150 into a measurable voltage.

The readout electronic circuit may comprise a specific component corresponding to an automatic exposure control (AEC) to ensure a relatively large dynamic range of detected infrared radiation. The readout electronic circuit 160 may, for example, include a light-to-frequency (L2F) convertor. An L2F pixel integrates charge up until a pre-determined limit and then resets itself, outputting a pulse. As it resets itself, it generally cannot be over-exposed or under-exposed. The operation of L2F pixels are described in U.S. Pat. Nos. 7,358, 584, and 7,265,332, for example, the entire contents of which are herein incorporated by reference.

Figure 2:
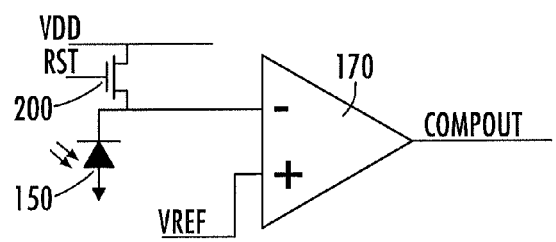
FIG. 2 is a schematic diagram of one embodiment of a readout electronic circuit suitable for use with the apparatus of FIG. 1.
Figure 3:
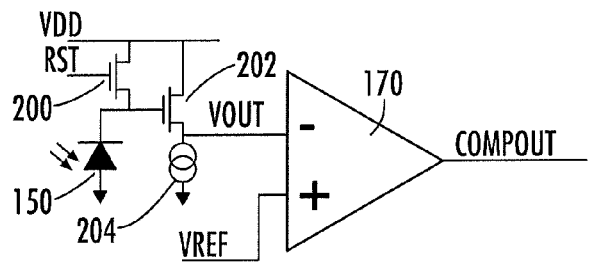
FIG. 3 is a schematic diagram of an alternative embodiment readout electronic circuit.

FIGS. 2 and 3 illustrate possible implementations of the readout electronic circuit 160. The photodiode 150 and operational amplifier 170 are the same as illustrated in FIG. 1. The input VREF is from the reference module 180 shown in FIG. 1. The remaining components show example implementations of the readout electronic circuit 160.

The implementation in FIG. 2 is a "one transistor" (1T) embodiment, where a reset transistor 200 is switchable by a reset signal RST to switch the inverting input of the operational amplifier 170 between a supply voltage VDD and the photodiode 150 voltage.

The implementation in FIG. 3 is a "three transistor" (3T) embodiment, comprising a reset transistor 200 and a source follower transistor 202 whose source is connected to the inverting input of the operational amplifier 170 and a current source 204.

Figure 4:
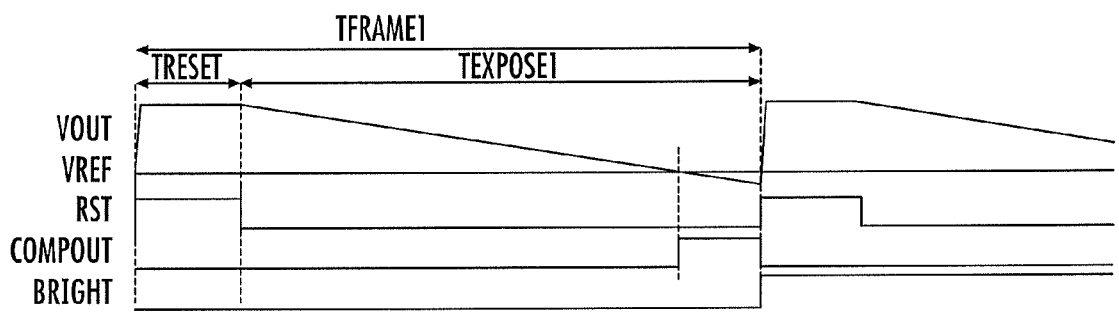
FIG. 4 is a timing diagram showing the operation of the circuits of FIGS. 2 and 3 in high levels of incident radiation.
Figure 5:
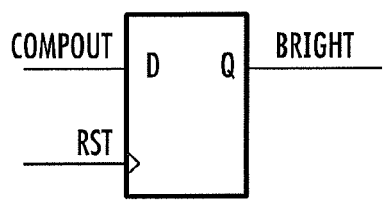
FIG. 5 is a schematic diagram of an embodiment of a memory element used for storage of an output from an operational amplifier used as part of the apparatus of FIG. 1.

The operation of the circuits of FIGS. 2 and 3 can be seen in FIG. 4. During a reset phase ($T_{reset}$) the signal RST goes high resetting the pixel (where the "pixel" comprises the combination of the photodiode and the readout electronics 160). After this, RST goes low and the pixel is sensitive to light and the photo-generated charge causes the voltage to decay. When the voltage VOUT is below that of the reference voltage VREF provided by the reference module 180, the output of the comparator COMPOUT goes high. The output level of COMPOUT can be stored at the end of each frame, shortly before the pixel is reset. One way of achieving this is shown in FIG. 5. The signal "BRIGHT" will be high if the radiation level is brighter than the threshold, and low if the radiation level is lower than the threshold.

Figure 6:
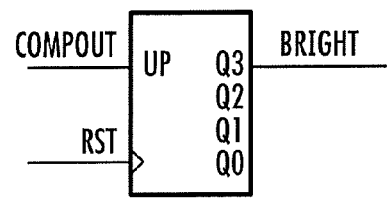
FIG. 6 is a schematic diagram of a memory element according to an alternative embodiment.

The circuit in FIG. 5 will store the "BRIGHT" signal for a single exposure. If there is a short change of radiation level (becoming either brighter or darker), then this will be quickly (1 frame=$T_{frame1}$) reflected in the output "BRIGHT". Sometimes this is undesirable, and in the case of ambient radiation level detector, it may be preferable that a single anomalous reading is rejected. FIG. 6 shows an embodiment that uses an "up/down counter" to achieve this. With this technique, the signal is monitored for several frames and short changes are ignored.

Figure 7:
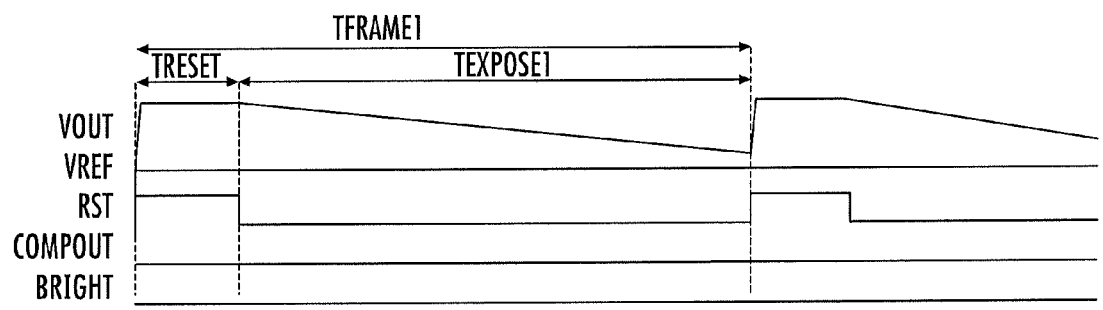
FIG. 7 is a timing diagram showing the operation of the circuits of FIGS. 2 and 3 in low levels of incident radiation.

In FIG. 4, the illumination is greater than the threshold. If the light level is reduced, a smaller amount of photo-generated charge is produced and the voltage on the photodiode may not decay enough to cross the threshold. This is seen in FIG. 7, wherein the signal "VOUT" remains above the threshold and so the output of the comparator "COMPOUT" remains low and the "BRIGHT" signal also remains low, indicating a dark scene.

Figure 8:
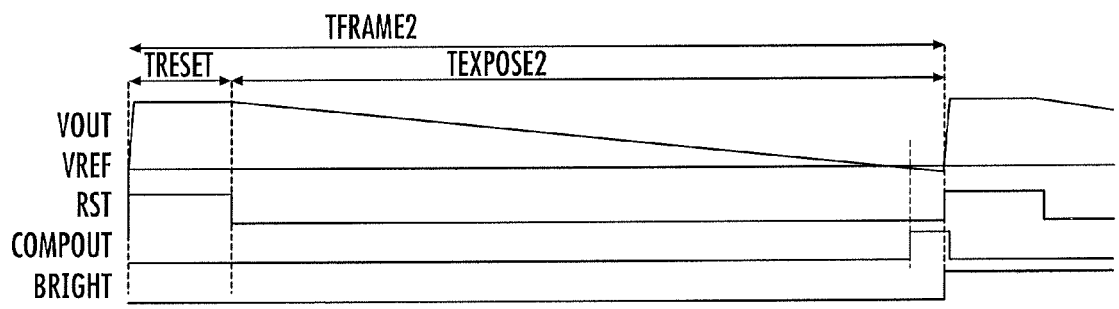
FIG. 8 is a schematic diagram of the timing diagram of FIG. 7, modified to have a longer exposure period.

If higher sensitivity of the system to light is desired, then either the voltage VREF can be increased, or the exposure time "$T_{expose1}$" can be increased. In FIG. 8, the light levels are the same as in FIG. 7—the slope of VOUT is the same, but as exposure time is increased ("$T_{expose2}$") the voltage decays further and crosses the "VREF" voltage, resulting in COMPOUT and BRIGHT going high.

The 1T and 3T pixels shown in FIGS. 2 and 3 have the charge to voltage conversion performed by the photodiode 150. Increasing the size of the photodiode (e.g. to collect more light and operate better under low light levels) may result in relatively large capacitance, which can largely negate any improvement in light collection and the resulting voltage swing is roughly constant.

Figure 9:
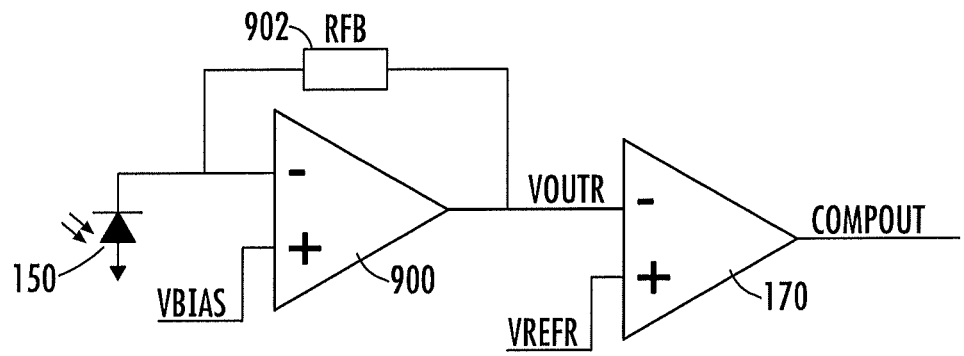
FIG. 9 is a schematic diagram of an alternative embodiment readout electronic circuit, with a transimpendance amplifier.
Figure 10:
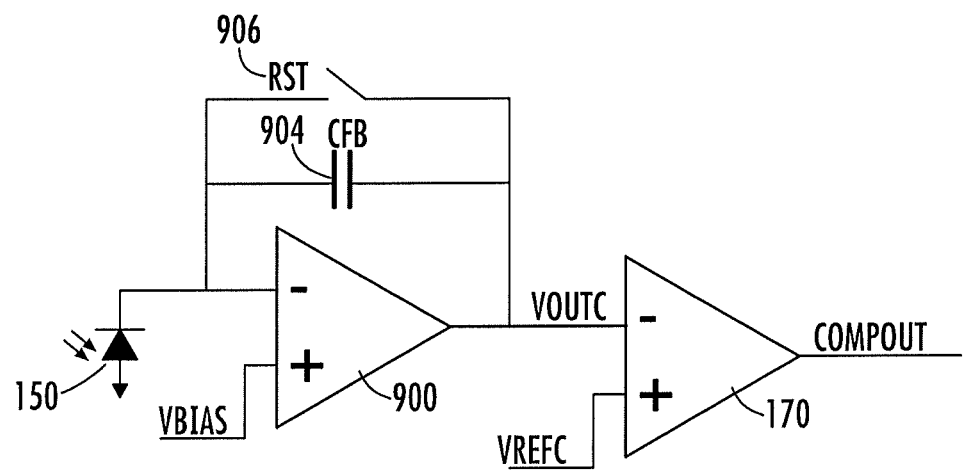
FIG. 10 is a schematic diagram of an alternative embodiment readout electronic circuit, with a charge amplifier and comparator.

FIGS. 9 and 10 show alternative embodiments of a readout electronic circuit 160, designed to address this issue and to provide a readout more suitable for operating in low light levels. Again, the photodiode 150 and operational amplifier 170 are the same as illustrated in FIG. 1. The inputs to the non-inverting input of the operational amplifier 170 (VREFR in FIG. 9 and VREFC in FIG. 10) are provided by the reference module 180 shown in FIG. 1. The remaining components show example implementations of the readout electronic circuit 160.

In FIG. 9 a second operational amplifier 900 and feedback resistor 902 ("RFB") are combined to form a transimpedance amplifier, which converts the current generated by the photodiode into a voltage "VOUTR". The light to voltage conversion is governed by the following equation: VOUTR=VBIAS+Iphoto×RFB. The change in output voltage is dependent on Iphoto×RFB, so a sensitive system requires a relatively large value of RFB, typically 1MΩ to 100MΩ. This may be difficult and relatively expensive to achieve on an integrated circuit, as the resistance of an element is proportional to its length and hence a large area is required for a high value of resistance.

In FIGS. 9 and 10, the op-amp (900) has a negative feedback loop, so it operates to keep both inputs (+ and −) at the same potential. Hence the cathode of the photodiode is also at VBIAS. This voltage is chosen to increase the collection of photo-generated charge. A lower voltage increases the width of the depletion region in the photodiode (the region where there is an electric field), but reduces the applied field, while a larger voltage decreases the width of the electric field, but has a larger field strength. Typical voltages are between about 0.5V to 2.5V.

FIG. 10 shows an alternative embodiment that addresses this issue. Here, a capacitor 904 (CFB) is used in the feedback of the second operational amplifier 900 to produce a charge amplifier. A reset switch 906 switches the second operational amplifier 900 between closed and open loop configuration. With this circuit, the output voltage VOUTC is given by the following equation: VOUTC=VBIAS+Iphoto×TINT/CFB. A relatively small capacitance produces a relatively large output voltage swing. This is more efficient when integrated on a silicon device.

Figure 11:
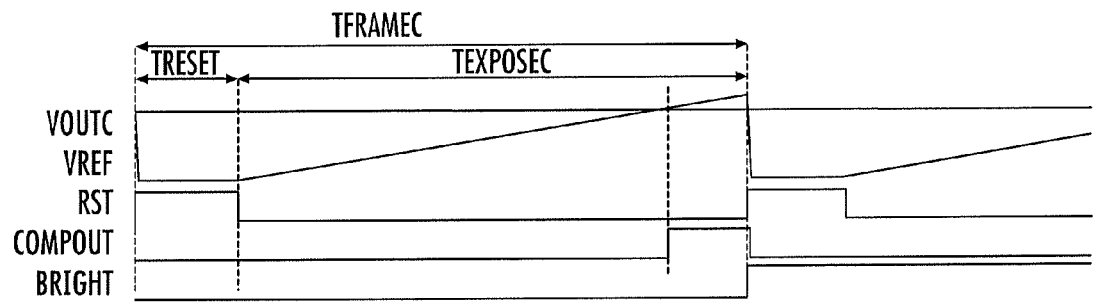
FIG. 11 is a timing diagram for the charge amplifier circuit of FIG. 10.

FIG. 11 shows the timing diagram for the charge amplifier pixel of FIG. 10. Here, there is a fixed length for the exposure period $T_{exposeC}$ and the reset period $T_{reset}$. The exposure period can be varied by lengthening $T_{frameC}$, depending on desired light levels in the same manner as described above for the 1T/3T pixel of FIGS. 3 and 4.

In an alternative embodiment, the charge amplifier pixel of FIG. 10 may be operated in a Light to Frequency mode. In this mode, the output of the comparator "COMPOUT" is used to reset the pixel. Hence no separate automatic exposure loop may be desired. As the frequency of COMPOUT pulses is now proportional to light, a separate counter measures this and produces an intensity value.

In the detector 110, the readout electronic circuit 160 is connected to the non-inverting input of an operational amplifier 170. A reference module 180 is connected to the inverting input of the operational amplifier 170. The reference module 180 provides a specific reference threshold value. In addition, the operational amplifier 170 may include a low pass filter. The low pass filter may be useful in the situation where infrared radiation interference occurs and produces a high level of infrared radiation, such as an infrared radiation from an infrared remote controller. Without the presence of the low pass filter, the detector 110 may take this high level of infrared radiation into account as a high level of infrared radiation from the incident radiation. Consequently, the detector 110 may erroneously indicate to the controller 120 to switch off the CFL. With the presence of the low pass filter, as in the present embodiment, the high level of infrared radiation is filtered as soon as the level of infrared radiation is above the specific reference threshold value for a specific time period. As a result, a high level of infrared radiation for a short period of time does not confuse the detector 110.

The reference threshold value may be a fixed value set during the manufacturing process of the low pass filter. Alternatively, the reference threshold value may be a variable value produced and controlled by a variable resistor.

The reference module 180 may comprise an additional module, for example, an exposure control module (not shown). The exposure control module manages the duration of exposure of the detector 110 to the incident radiation. In the situation where the level of visible light is low, the exposure control module may set a relatively long exposure duration to improve the quality and the quantity of the received incident radiation on the detector 110. In the situation where the level of visible light is higher, the exposure control module may set a relatively short exposure duration as the high level of visible light allows a detection of received radiation on the detector 110 in a correct quality and quantity more quickly.

The electronic module 114 may also comprise an additional module, for example, a programming module (not shown). To program the unit (100) to switch on or off at an appropriate ambient light level, the user would wait until the ambient light level was at the threshold and then signal to the unit (100) to measure the current ambient light levels and store this as the reference value (180). This could be achieved by adding a switch to the unit. This may be undesirable as it may add costs and may easily be inaccessible to the user due to the location of the CFL system. A practical approach would be for the user to briefly interrupt the main supply to the unit in a predetermined pattern (e.g. off for 1 second, on for 1 second, off again for 1 second, and finally on again). The programming module would detect this sequence, obtain a reading of the ambient light level using 112, and store this level in the reference means (180).

In the situation, where the value of the detected level of infrared radiation is below the reference threshold value, the control part 120 can automatically switch on the radiation source 130 of the CFL 100. In the situation, where the value of the detected level of infrared radiation is above the reference threshold value, the controller 120 can automatically switch off the radiation source 130 of the CFL 100.

The ambient light sensor in accordance with the present embodiments is suitable for use in any compact fluorescent lamp, LED based lighting system, or any "cold, intelligent" lighting system—i.e. one which does not emit IR radiation and includes control electronics.

Figure 14:
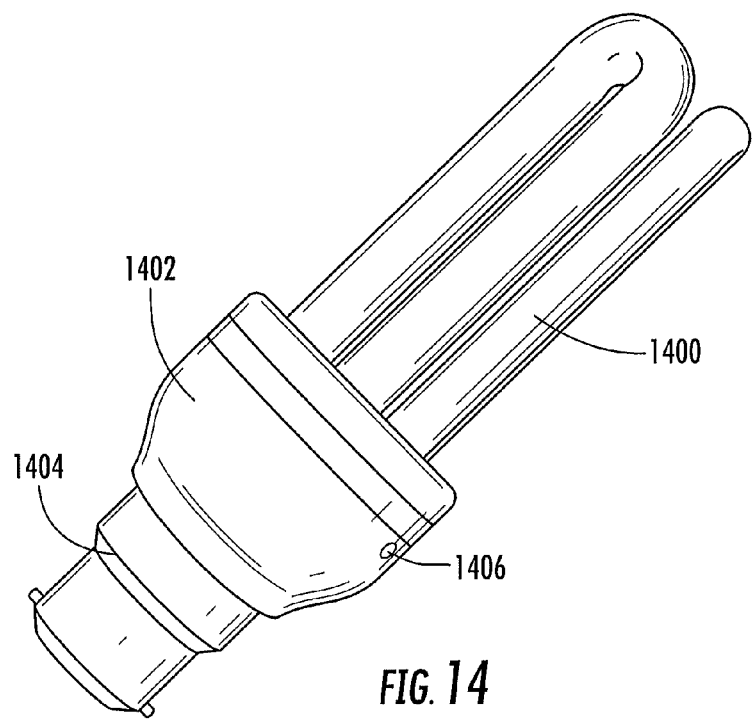
FIG. 14 is a diagram of a CFL according to an aspect of the invention.

FIG. 14 shows an example of a CFL according to the disclosure. It will be appreciated that this is only one illustrative example, and that the principles of this disclosure may be applied to any form of CFL.

A CFL comprises a tube 1400, which is driven by ballast circuitry. The ballast circuitry is contained within a housing 1402. The tube 1400 is filled with a gas such as mercury vapor that emits UV light when an electrical current is passed through it. The tube is also coated on an inner surface with a phosphorous material that fluoresces when UV radiation is incident upon it. The ballast circuitry controls the current applied during the operation of the lamp. The structure of the lamp and the operation of the ballast circuitry are well known. Some CFLs are also provided with a light fitting 1404, such as an Edison screw of a bayonet fitting.

An ambient radiation sensor 1406 is provided as an integrated part of the CFL of FIG. 14. In this example, the ambient radiation sensor is provided as an integrated component of the housing 1406 that contains the ballast circuitry. An aperture can be formed in the housing 1406 to let light pass through to the sensitive portion of the ambient radiation sensor substrate underneath. A light pipe may also be used to enable light to pass to the sensor. In an alternative embodiment, the ambient radiation sensor can be printed or affixed to the outside surface of the housing 1406. In either case, the ambient radiation sensor is electrically connected to the ballast circuitry as discussed above. It will be appreciated that the embodiments may be carried in many different ways and still remain within the intended scope and spirit of the invention.

That which is claimed:

1. A compact fluorescent lamp (CFL) comprising:
   a compact fluorescent radiation source;
   a infrared radiation sensor; and
   a controller coupled to said infrared radiation sensor and configured to switch said compact fluorescent radiation source on and off based upon said infrared radiation sensor;
   said infrared radiation sensor comprising
      a radiation receiving module comprising a photodiode and an infrared filter coupled thereto and configured to filter infrared radiation to obtain an infrared radiation level value, said photodiode comprising a substrate having a very heavily doped bulk portion of a first conductivity type, a lightly doped upper layer of the first conductivity type carried by said substrate, a heavily doped region of the first conductivity type carried by said lightly doped upper layer, a lightly doped region of a second conductivity type also carried by said lightly doped upper layer, and a heavily doped region of the second conductivity type carried within said lightly doped region, and
      an electronic module coupled to said radiation receiving module and configured to cooperate with said controller to switch said compact fluorescent radiation source based upon comparing the infrared radiation level value to a threshold.

2. The CFL of claim 1, further comprising a ballast housing, and wherein said infrared radiation sensor is carried by said ballast housing.

3. The CFL of claim 2, wherein said ballast housing has an aperture therein aligned with said infrared radiation sensor.

4. The CFL of claim 1, further comprising a light guide configured to pass radiation to said infrared radiation sensor.

5. The CFL of claim 1, wherein a depth of a junction between said lightly doped upper layer and said lightly doped region is based upon collection of electrons from photogeneration of radiation in the infrared and visible spectra.

6. The CFL of claim 1, wherein said substrate comprises a silicon substrate.

7. The CFL of claim 1, wherein said electronic module comprises a read out electronic circuit coupled to said photodiode and configured to convert current from said photodiode into a voltage.

8. The CFL of claim 1, wherein said electronic module comprises a reference module configured to provide the threshold.

9. The CFL of claim 8, wherein said reference module comprises an exposure control module configured to adjust a range of infrared radiation for said photodiode.

10. The CFL of claim 8, wherein said reference module comprises a programming module configured to set the threshold to a value corresponding to an ambient light level.

11. An infrared radiation sensor for a compact fluorescent lamp (CFL) comprising a compact fluorescent radiation source and a controller configured to switch the compact fluorescent radiation source on and off, the infrared radiation sensor comprising:
 a radiation receiving module comprising a photodiode and an infrared filter coupled thereto and configured to filter infrared radiation to obtain an infrared radiation level value, said photodiode comprising a substrate having a very heavily doped bulk portion of a first conductivity type, a lightly doped upper layer of the first conductivity type carried by said substrate, a heavily doped region of the first conductivity type carried by said lightly doped upper layer, a lightly doped region of a second conductivity type also carried by said lightly doped upper layer, and a heavily doped region of the second conductivity type carried within said lightly doped region; and
 an electronic module coupled to said radiation receiving module and configured cooperate with the controller to switch the compact fluorescent radiation source based upon comparing the infrared radiation level value to a threshold.

12. The infrared radiation sensor claim 11, wherein a depth of a junction between said lightly doped upper layer and said lightly doped region is based upon collection of electrons from photogeneration of radiation in the infrared and visible spectra.

13. The infrared radiation sensor of claim 11, wherein said electronic module comprises a read out electronic circuit coupled to said photodiode and configured to convert current from said photodiode into a voltage.

14. The infrared radiation sensor of claim 11, wherein said electronic module comprises a reference module configured to provide the predetermined reference threshold value.

15. The infrared radiation sensor of claim 14, wherein said reference module comprises an exposure control module configured to adjust a range of infrared radiation for said photodiode.

16. The infrared radiation sensor of claim 14, wherein said reference module comprises a programming module configured to set the threshold to a value corresponding to an ambient light level.

17. A method of operating a compact fluorescent lamp (CFL) comprising:
 sensing infrared radiation using a photodiode and an infrared filter coupled thereto, the photodiode comprising a substrate having a very heavily doped bulk portion of a first conductivity type, a lightly doped upper layer of the first conductivity type carried by the substrate, a heavily doped region of the first conductivity type carried by the lightly doped upper layer, a lightly doped region of a second conductivity type also carried by the lightly doped upper layer, and a heavily doped region of the second conductivity type carried within the lightly doped region; and
 switching a compact fluorescent radiation source on and off based upon the sensed infrared radiation.

18. The method of claim 17, wherein a depth of a junction between the lightly doped upper layer and the lightly doped region is based upon collection of electrons from photogeneration of radiation in the infrared and visible spectra.

19. A method of operating a compact fluorescent lamp (CFL) comprising:
 sensing infrared radiation using a photodiode and an infrared filter coupled thereto, the photodiode comprising a substrate having a very heavily doped bulk portion of a first conductivity type, a lightly doped upper layer of the first conductivity type carried by the substrate, a heavily doped region of the first conductivity type carried by the lightly doped upper layer, a lightly doped region of a second conductivity type also carried by the lightly doped upper layer, a heavily doped region of the second conductivity type carried within the lightly doped region, and a triple well structure of the first conductivity type carried within the lightly doped region, wherein a junction between the lightly doped upper layer and the lightly doped region is carried within the lightly doped upper layer adjacent the substrate; and
 switching a compact fluorescent radiation source on and off based upon the sensed infrared radiation.

* * * * *

UNITED STATES PATENT AND TRADEMARK OFFICE
CERTIFICATE OF CORRECTION

| | | |
|---|---|---|
| PATENT NO. | : 8,796,936 B2 | Page 1 of 1 |
| APPLICATION NO. | : 12/969095 | |
| DATED | : August 5, 2014 | |
| INVENTOR(S) | : Raynor | |

It is certified that error appears in the above-identified patent and that said Letters Patent is hereby corrected as shown below:

In the Claims

Column 11, Line 27　　　Delete: "configured cooperate"
　　　　　　　　　　　　Insert: --configured to cooperate--

Column 11, Line 31　　　Delete: "sensor claim"
　　　　　　　　　　　　Insert: --sensor of claim--

Signed and Sealed this
Thirtieth Day of June, 2015

Michelle K. Lee
*Director of the United States Patent and Trademark Office*